United States Patent [19]

Axel et al.

[11] Patent Number: 5,054,489

[45] Date of Patent: Oct. 8, 1991

[54] MAGNETIC RESONANCE IMAGING USING SPATIAL MODULATION OF MAGNETIZATION

[75] Inventors: Leon Axel, Philadelphia, Pa.; Lawrence Dougherty, Wenonah, N.J.

[73] Assignee: The Trustees of the University of Pennsylvania, Philadelphia, Pa.

[21] Appl. No.: 254,454

[22] Filed: Oct. 6, 1988

[51] Int. Cl.⁵ .............................................. A61B 5/055
[52] U.S. Cl. ................................. 128/653 A; 128/695
[58] Field of Search ............ 128/653 A, 653 AF, 695; 324/306, 309, 312

[56] References Cited

U.S. PATENT DOCUMENTS 4,752,734 6/1988 Wedeen ................................ 324/306
4,953,554 9/1990 Zerhouni et al. ................. 128/653 A

OTHER PUBLICATIONS

Hore, P. J., Solvent Suppression in Fourier Transform Nuclear Magnetic Resonance, *Journal of Magnetic Resonance*, vol. 55, 1983, pp. 283-300.
Zerhouni, et al., "Human Heart: Tagging with MR Imaging-A Method for Noninvasive Assessment of Myocardial Motion", *Cardiac Radiology*, vol. 169, No. 1, 1988, 59-63.

*Primary Examiner*—Ruth S. Smith
*Attorney, Agent, or Firm*—Woodcock Washburn Kurtz Mackiewicz & Norris

[57] ABSTRACT

A novel magnetic resonance imaging technique provides direct imaging of motion by spatially modulating the degree of magnetization prior to imaging. The pre-imaging pulse sequence consists of an RF pulse to produce transverse magnetization, a magnetic field gradient pulse to "wrap" the phase along the direction of the gradient and a second RF pulse to mix the modulated transverse magnetization with the longitudinal magnetization. The resulting images show periodic stripes due to the modulation. Motion between the time of striping and image formation is directly demonstrated as a corresponding displacement of the stripes. Applications include studies of heart wall motion and distinguishing slowly moving blood from thrombus.

19 Claims, 7 Drawing Sheets

MAGNETIC RESONANCE IMAGING USING SPATIAL MODULATION OF MAGNETIZATION

BACKGROUND OF THE INVENTION

Magnetic resonance signals have long been known to be sensitive to motion. One of the principal sources of motion sensitivity is the fact that when the local magnetization of a material is altered, it carries the altered magnetization with it when it moves (within the limits of the relaxation times). It has been known to measure blood flow by locally altering the magnetization of blood and then detecting the passage of this "tagged" blood downstream. Analogous techniques have been proposed for measurement of blood flow with magnetic resonance imaging (MRI) by detecting the passage of blood with locally saturated or inverted magnetization through the region being imaged. Other techniques have been proposed for imaging of myocardial motion within the plane of the image by using selective excitation to produce a pattern of lines of altered magnetization whose motion may be followed.

SUMMARY OF THE INVENTION

Novel magnetic resonance imaging methods provide direct imaging of motion by spatially modulating the degree of magnetization prior to imaging. The pre-imaging pulse sequence consists of an RF pulse to produce transverse magnetization, a magnetic field gradient pulse to "wrap" the phase along the direction of the gradient and a second RF pulse to mix the modulated transverse magnetization with the longitudinal magnetization. The resulting images show periodic stripes due to the modulation. Motion between the time of striping and image formation is directly demonstrated as a corresponding displacement of the stripes. Applications include, but are not limited to, studies of heart wall motion and distinguishing slowly moving blood from thrombus.

It is an object of the present invention to provide methods of magnetic resonance imaging of a patient.

It is another object of the present invention to provide NMR signals for imaging of a patient which are spatially modulated.

It is another of the present invention to provide methods of observing heart wall motion of a patient with magnetic resonance imaging.

It is another object of the present invention to provide methods of magnetic resonance imaging of a patient utilizing radio frequency pulses having both transverse and longitudinal components.

These and other novel advantages, features and objects of the present invention are realized by methods of magnetic resonance imaging of patients comprising the steps of pre-imaging the patient with radio frequency pulse sequence having phases which produce transverse magnetization in the patient. In preferred embodiments, it is desired to wrap the phase of the transverse magnetization along a magnetic field gradient pulse thereby modulating the transverse magnetization. In further preferred embodiments, mixing the modulated transverse magnetization with a radio frequency pulse which produces longitudinal magnetization is accomplished. Observing the magnetic resonance signals emitted from the patient is then accomplished.

DETAILED DESCRIPTION OF PREFERRED EMBODIMENTS

These methods produce periodic spatial modulation of magnetization (SPAMM) prior to imaging, by using a sequence of two nonselective RF pulses separated by a magnetic field gradient ("gradient") pulse. Starting from a condition of uniform longitudinal magnetization the first RF pulse turns some of this magnetization (all, in the case of a 90 degree flip angle) into transverse magnetization, all initially with the same phase. The gradient pulse produces a periodic spatial modulation of the phase of the transverse magnetization and "wraps" it along the direction of the gradient. The second RF pulse mixes the modulated transverse magnetization with the longitudinal magnetization, producing modulated longitudinal magnetization. Although the second RF pulse need not be identical to the first, if it has the same flip angle, the longitudinal magnetization will be restored to its initial value at the peaks of the modulation. The phase of the second RF pulse is unimportant, except to determine the relative phase of the spatial modulation pattern. A optional second gradient pulse can be used to "spoil" the remaining transverse magnetization. The use of gradients for slice selection in the subsequent imaging sequence will also achieve this result. The net result is the production of a stack of planes or bands of modulated magnetization.

Thus, the SPAMM sequence is analogous to classical 2-D NMR with its phases of preparation, evolution and mixing, with the subsequent imaging sequence providing detection. Longitudinal relaxation between production of the bands and imaging will reduce the amplitude of modulation. The initial amplitude of modulation of the magnetization is determined by the choice of flip angle (e.g., a 45 degree flip angle produces bands of saturation at the troughs; a 90 degree flip angle produces bands of inversion). The orientation of the bands is determined by the choice of the direction of the wrap gradient. The separation of the bands is inversely proportional to the strength and duration of the wrap gradient. For example, a rectangular gradient pulse of 0.6 msec duration and 0.8 gauss/cm amplitude will produce a band spacing of 0.5 cm. The spacing of the bands resulting from a gradient pulse of known shape and duration ca be used to calibrate the gradient strength. Chemical shift differences between two regions will produce a relative displacement in the positions of the band patterns. A second set of modulation bands, e.g., in an orthogonal direction to the first, can be produced by following the second RF pulse with a second wrap gradient in an appropriate direction and then following it with a third RF pulse.

In the presence of magnetic field inhomogeneities (effectively creating local gradients), the bands of modulated magnetization may become non-parallel. Keeping the time between the RF pulses short will reduce the evolution of phase modulation due to field inhomogeneity and thus minimize this effect. For studies of cardiac motion, keeping this time short also minimizes the delay between R-wave detection and initiation of imaging. Alternatively, increasing the time between the RF pulses and eliminating the first gradient pulse will produce amplitude variation in the subsequent image that will directly display the distribution of field variations. Nonlinearity of the wrap gradient will also result in nonparallel bands. However, in this case, decreasing the time between the RF pulses will not reduce the effect. Non-parallel bands can be used to directly display the distribution of gradient nonlinearity.

The fundamental equation in magnetic resonance imaging is the Larmor relationship between the resonance frequency, $\omega$, and the magnetic field, B $$\omega = \gamma B \quad (1)$$

where $\gamma$, the proportionality constant, is defined as the gyromagnetic ratio. The magnetic field experienced by a nucleus at a position r is given by the sum of the main magnetic field, $B_o(r)$, and any applied magnetic field gradients. For the case of linear gradient fields and a homogeneous main field, we can write $$B(r) = B_o + G \cdot r \quad (2)$$

Chemical shift effects can produce a further change in effective magnetic field, e.g., between fat and water:

$$B_{eff} = B(1-\sigma) \quad (3)$$

where the difference in the chemical shift parameter, $\sigma$, is on the order of 3 ppm for fat and water.

The magnetic resonance signal is detected relative to a reference frequency, typically set equal to that of water in the average main field. The phase $\phi$ of the transverse magnetization will evolve in time at a rate dependent on the difference between the local resonance frequency and the reference frequency. In the absence of chemical shift effects and for a uniform main field with the reference tuned to the resonance frequency and linear gradients, the gradients will cause the phase to evolve as:

$$\phi(r) = \gamma \int G(t) \cdot r \, dt \quad (4)$$

This corresponds to a sinusoidal modulation of the x and y components of the transverse magnetization (with a 90 degree phase shift between them) along the direction of the applied gradient, with a spatial wavelength, R, of $$R = 2\pi / \gamma \int G(t) dt \quad (5)$$

Thus, the spacing of the final stripes will depend inversely on the integral of the gradient pulse. If there are nonlinearities of the gradients, as may be found towards the ends of the magnet, the spacing of the stripes will change correspondingly, with the stripes flaring out as the gradients become weaker. If two regions have chemical shift parameters differing by $\Delta\sigma$, the stripes will have the same spacing in each region, but the patterns will be offset from each other by a distance, d, given by $$d = \gamma B_o \Delta t \Delta \sigma$$

where $\Delta t$ is the time between the two RF pulses. (6)

Similarly, in the presence of magnetic field inhomogeneity, $\Delta B(r)$, arising either from imperfections in the magnet or from the object being imaged (e.g., due to regional susceptibility variations) we will get a corresponding local phase offset at the time of the second RF pulse of $$\Delta\phi(r) = \epsilon \Delta B(r) \Delta t \quad (7)$$

This will cause the stripes to deviate from parallel. Both these effects can be minimized by keeping $\Delta t$ short, as can be seen from equations 6 and 7.

The spatial modulation of the longitudinal magnetization is made visible by the resulting modulation of the transverse magnetization in the subsequent imaging pulse sequence, appearing as stripes with sinusoidal variation of intensity in the image. Phase alternation of the refocusing RF pulses in the imaging sequence ca help prevent artifacts due to stimulated echoes. The stripes correspond to the intersection of the bands of modulation and the imaged slice. If the wrap gradient is chosen to be orthogonal to the direction of the slice selection gradient, the spacing of the stripes in the image will be equal to the distance between the bands of modulation for RF flip angles less than or equal to 45 degrees.

Most MRI systems display the magnitude, but not the sign of the magnetization. Therefore, if the SPAMM sequence produces inversion of the magnetization (i.e., RF flip angle greater than 45 degrees), intensity minima will be seen in the image at points where the longitudinal magnetization crosses through zero immediately prior to imaging. Thus, for modulation with inversion of magnetization there will be twice a many stripes in the resulting image as in one with only saturation. With increasing delay between the SPAMM sequence and imaging, longitudinal relaxation will result in the pairwise merging of the stripes at a time when the magnetization in the troughs equals zero. Further delays will result in fading of the stripes but no further movement (for stationary tissue). The time of merging of the stripes with initial inversion modulation can be used to estimate the value of the local T1 relaxation time, analogous to the use of T null in classical inversion-recovery measurements of T1.

In the case of RF strength inhomogeneity, the degree of inversion will correspondingly vary across the image. This will be reflected in varying spacing between the pairs of stripes, providing a means for demonstrating the RF inhomogeneity independent of image intensity. If only saturation is produced in the modulation, the position of the stripes is independent of RF strength, making this technique robust to RF variation when used for studying motion.

Due to longitudinal relaxation, the stripes produced by modulation with saturation at the troughs will not persist as long as those produced by inversion. However, if, for example, it is desired to study the diastolic phase in a subject with a slow heart rate, a delay could be introduced between R-wave detection and the SPAMM sequence, e.g., to the end of the systole.

In stationary tissue, the stripes will remain stationary with different delays between SPAMM and imaging except for merging of pairs of stripes described above for modulation that produces inversion. With increasing delays, the stripes will fade (assuming no inversion) at a rate determined by the local T1 relaxation times. In moving tissue, the stripes will move with the tissue. The displacement of the stripes indicates the corresponding amount of motion at right angles to the stripes between the time of tissue labelling by SPAMM and subsequent signal detection by imaging. The positions of the stripes in surrounding stationary tissues provides a convenient visual reference for assessing motion, while more precise measurements of motion can be made by comparing to an image made immediately after labelling. If there is danger of aliasing due to motion greater than the inter-stripe distance, the stripe spacing can be increased by decreasing the wrap gradient (amplitude or duration) or additional images can be made at intermediate times when less motion has occurred.

In the case of more complex motion moving the object through the imaging plane, the degree of such motion can be assessed by acquiring an orthogonal set of images with stripes corresponding to the orientation of the original image plane, in order to permit correction for such pull-through effects. As the stripes are formed by a intersection of the modulated bands with the slice, if the object rotates through the imaging plane, the obliqueness of the intersection may decrease the visibility of the stripes. This can be minimized by minimizing the slice thickness.

The primary function of the heart is contracting, and it is to be expected that diseases of the heart such a ischemia or infarction would generally result in altered contraction patterns. The direct demonstration of the contraction of cardiac muscle has previously bee difficult. Most imaging techniques show only the inner or outer surfaces of the heart, but do not directly show motion of the muscle itself. For example, simple fluoroscopy or kymography shows motion of the outline of a projection of the cardiac silhouette. Intravascular contrast studies and radionuclide-labelled red cell studies only show motion of the endocardial surface. Conventional MRI and CT can show the wall thickness, but still cannot follow motion within the wall. Invasive placement of radiopaque markers, such as beads or screws, or ultrasound transducers permits tracking of actual fixed points on the heart wall. However, there is still a relatively coarse sampling of these points on the heart, and the distribution of the motion between these points, e.g., transmurally, is still not well defined.

In contrast to these older techniques, MRI studies with magnetic labelling of the myocardium permits a direct demonstration of myocardial motion across the thickness of the wall and at many effective locations. Absolute, as well as relative motions of the heart can be measured. The particular technique for myocardial labelling presented here is flexible, fast and easy to use and provides labelling of large regions. Although we could alternatively us tailored RF pulses to selectively excite (for saturation or inversion) particular "planes" through the region to be imaged, in order to label multiple planes it will require either large RF power in one (or a few) pulses or a series of pulses which may take a relatively long time. This has two potentially bad consequences: it increases the delay after the R-wave before data can be taken, and it may introduce significant differences in the times at which different planes are labelled, potentially complicating the analysis. One relative advantage of the selective excitation technique for labelling is that relatively sharply defined bands can be produced, while the SPAMM technique produces sinusoidal profiles of the labelled bands.

One problem that has affected all tomographic studies of heart wall motion is that the motion of the heart through the fixed planes of imaging can result in apparent motion and thickening of a region simply due to the geometrical effect of tangentially cutting through the curved surfaces of the heart wall in a more peripheral location as the heart is pulled through the imaging plane. Thus, study of myocardial motion must involve 3-dimensional analysis to correct for such pull-through effects. Suitable orthogonal sets of striped images can provide the data needed for such an analysis. Also, although pull-through effects may change the apparent thickness of the heart wall they will not change the spacing of the stripes, permitting the distinction of pull-through from true contraction even on a single set of images.

The SPAMM sequence described herein has been implemented on a conventional commercial 1.5 T MRI system (GE Signa). In practice, a separate spoil pulse is unnecessary, as the imaging gradients will perform the spoiling function. A conventional cardiac gated imaging sequence may be modified by adding the SPAMM sequence prior to imaging. The total duration of the sequence is preferably less than 3 msec, thereby adding a minimal delay to the initiation of imaging after R-wave detection. The SPAMM sequence only minimally increases the RF dose of the imaging sequence.

Figure 1:
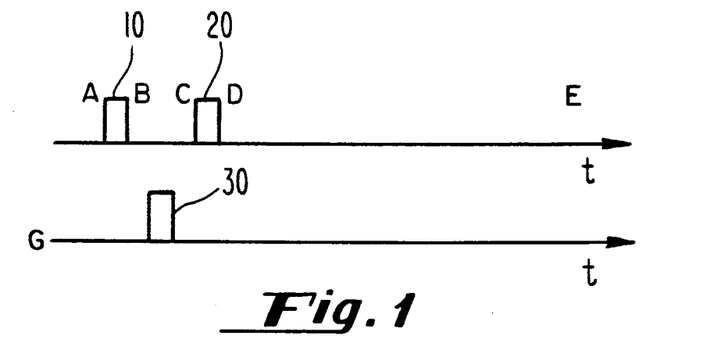
FIG. 1 is a timing diagram of a pulse sequence for spatial modulation of magnetization (SPAMM) of an organ of interest.

Referring now to the drawings wherein like reference numerals refer to like elements, FIG. 1 is timing diagram of a pulse sequence for spatial modulation of magnetization prior to imaging provided in accordance with the present invention. The time "t" is on the horizontal axis and G is the "wrap" gradient embodiments. A first non-selective RF pulse is shown at 10. A second non-selective RF pulse is shown at 20. Similarly, the gradient or "wrap" pulse is shown at 30 and separates the two RF pulses 10 and 20 in time. Letters A through E schematically indicate the corresponding times of the leading and rising edges of pulses 10 and 20 where the time between A and B is assumed to be short relative to the relaxation times, and times, and time E is large relative to times A, B, C and D.

Figure 2A:
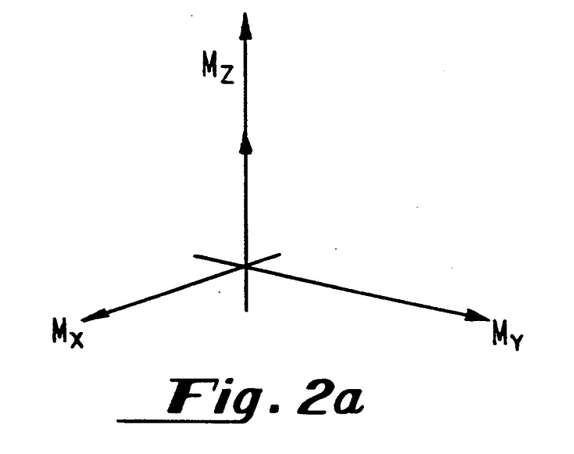
FIG. 2A through 2D illustrate total magnetization and components of magnetization of the organ of interest prior to initiation of the modulation sequence of FIG. 1
Figure 2B:
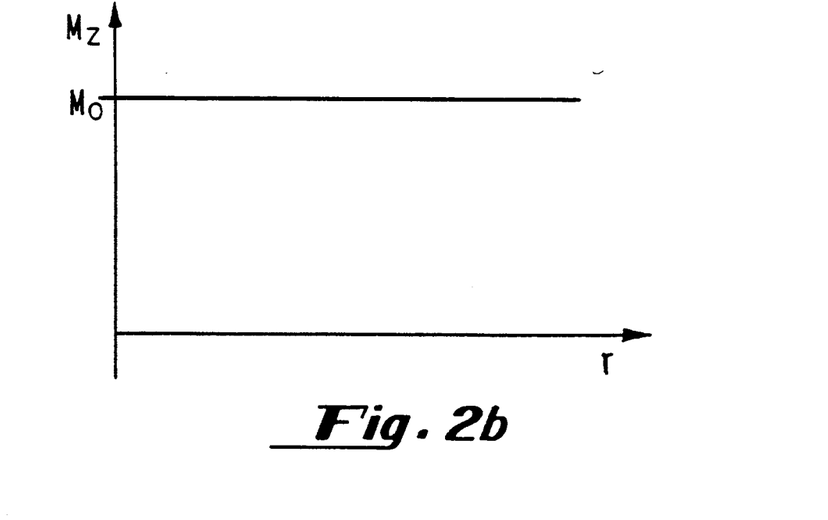
Figure 2C:
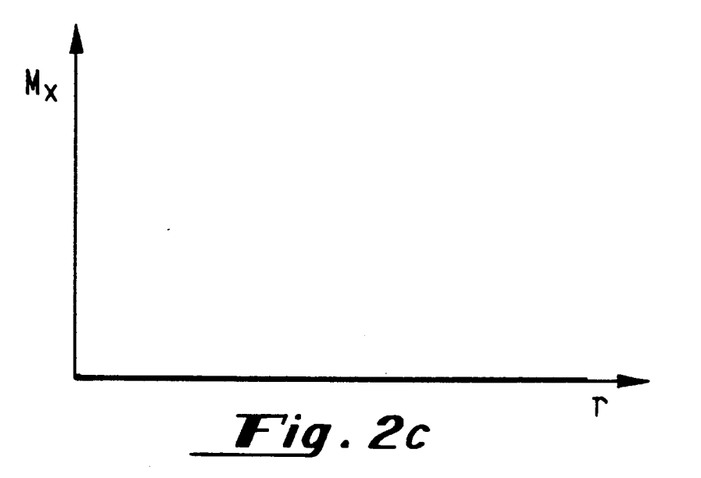
Figure 2D:
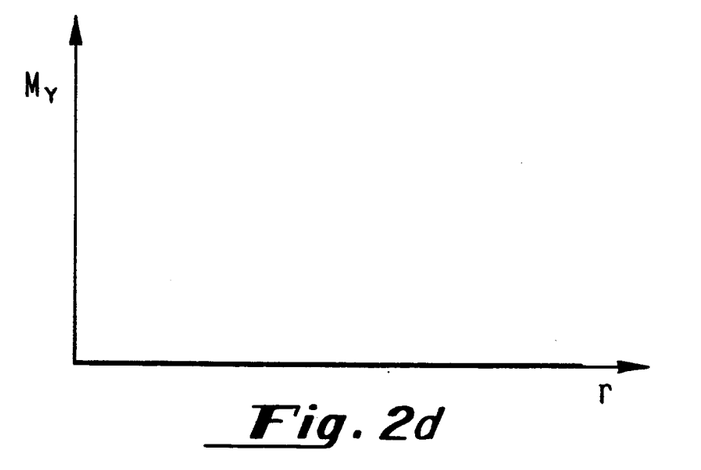

FIG. 2A illustrates the state of the magnetization of the organ of interest or "body portion" as the terms are used interchangeably herein, prior to the initiation of a modulation sequence at time A. The total distribution of the magnetization in a rotating frame, $M_o$, is initially all polarized with the value $M_o$ along the main magnetic field in the Z direction. The components of the magnetization in the X, Y and Z directions are respectively $M_x$, $M_y$ and $M_z$. FIG. 2B graphs the state of the magnetization prior to initiation of the modulation sequence at time A in FIG. 1. The distribution of the longitudinal magnetization $M_z$ is shown along the radial direction r. In FIG. 2C, the state of the magnetization prior to initiation of the modulation sequence at time A shows that the distribution of $M_x$ in the rotating frame is a function of r and is completely in the r direction. Similarly, FIG. 2D shows that the distribution of $M_y$ is a function of r, and $M_y$ is in the direction of r before initiation of the SPAMM sequence.

Figure 3A:
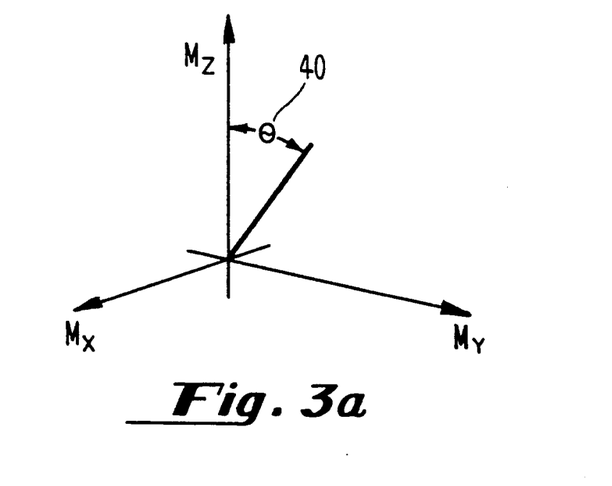
FIGS. 3A through 3D illustrate the total magnetization and components of the magnetization after a first RF pulse is applied to the organ of interest.
Figure 3B:
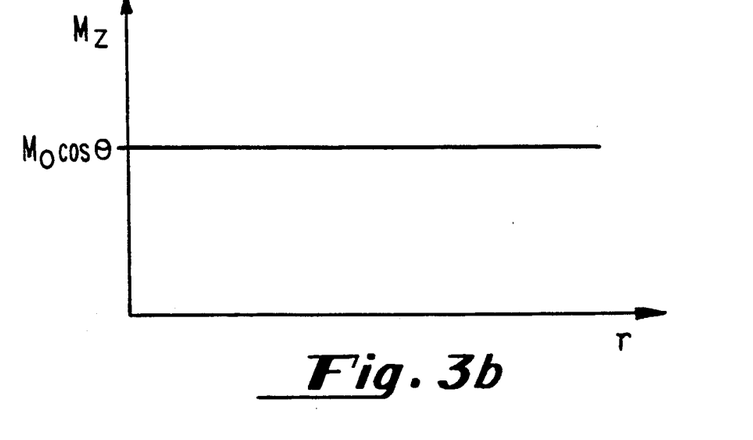
Figure 3C:
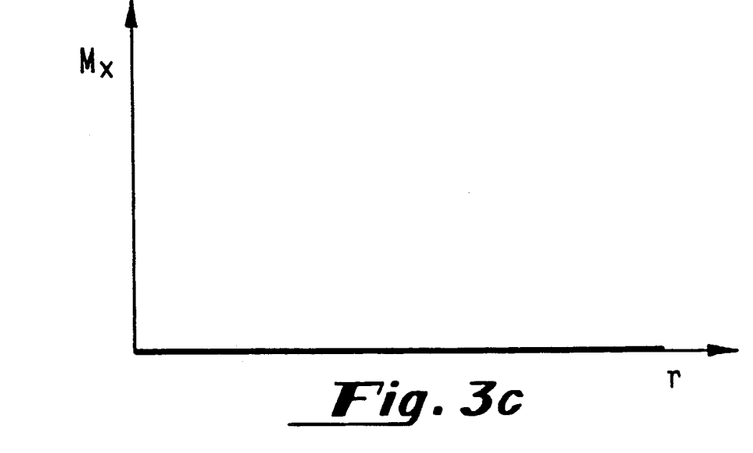
Figure 3D:
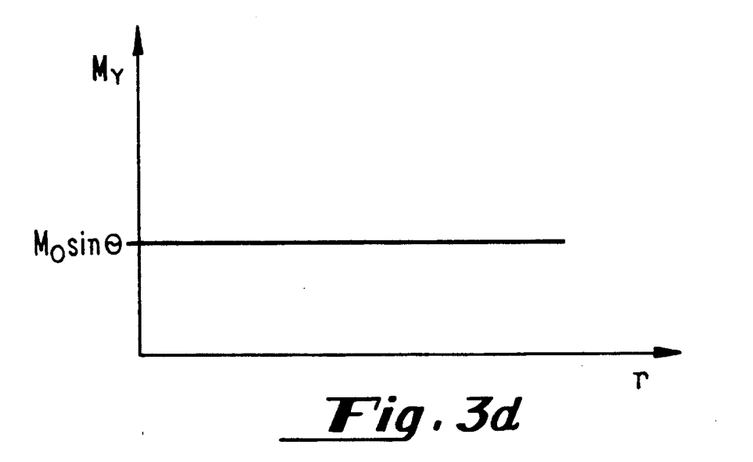

Referring now to FIG. 3A, the magnetization of the sample after the first RF pulse 10 at time B in FIG. 1 is illustrated. The RF pulse produces a flip angle, $\theta$, shown generally at 40 having a phase along $M_x$ in a rotating frame. FIG. 3B graphs the magnetization of FIG. 3A after the first RF pulse 10 at time B in FIG. 1, while FIGS. 3C and 3D graph $M_x$ and $M_y$ respectively after the first RF pulse provides flip angle in the rotating frame.

Figure 4A:
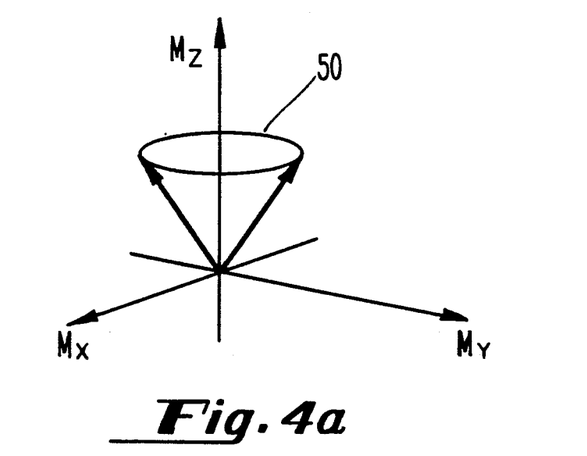
FIGS. 4A through 4D illustrate the total magnetization and components of the magnetization after a second "wrap" or modulating gradient pulse is applied to the organ of interest wherein the second modulating pulse has a wavelength equal to $2\pi/\gamma \int G(t)dt$.
Figure 4B:
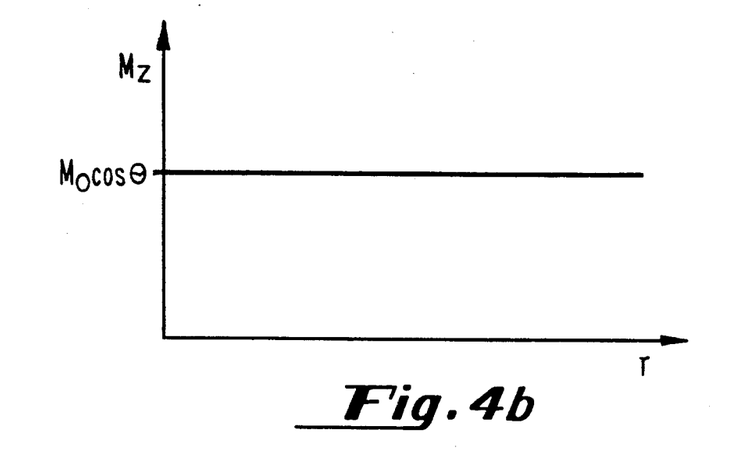
Figure 4C:
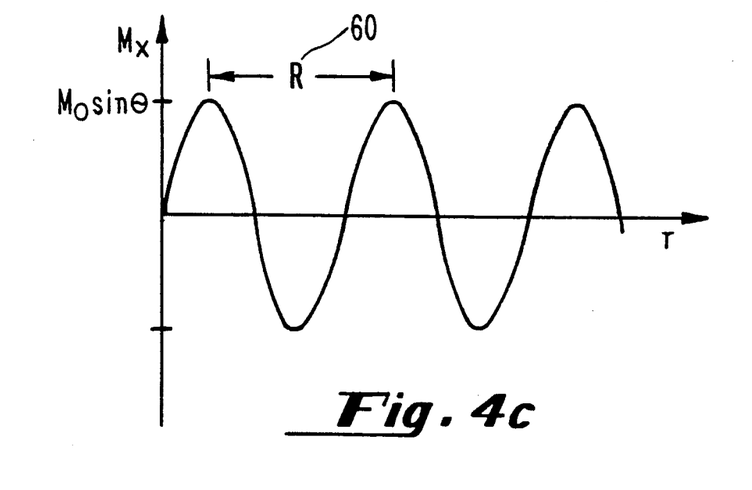
Figure 4D:
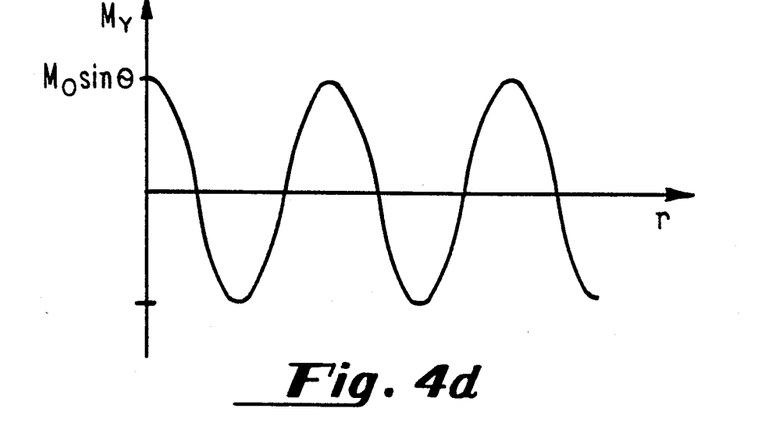

Referring to FIG. 4A, the magnetization at time C in FIG. 1 after the modulating gradient pulse 30 is applied to the sample is shown. The various components of the magnetization $M_x$, $M_y$ and $M_z$ form a cone 50 in the rotating frame around the $M_z$ axis. FIG. 4B graphs $M_z$ FIG. 4A after the wrap gradient pulse is applied where the value of $M_z$ is a constant $M_o \cos\theta$. In FIG. 4C, the $M_x$ component of FIG. 4A takes on sinusoidal values varying between the $M_o \sin\theta$ and the $-M_o \sin\theta$, wherein the wavelength of $M_x$ is R, shown generally at 60. In preferred embodiments, r has a value equal to $2\pi/\gamma \int G dt$. Examination of $M_y$ in FIG. 4D shows that it is also sinusoidal.

Figure 5A:
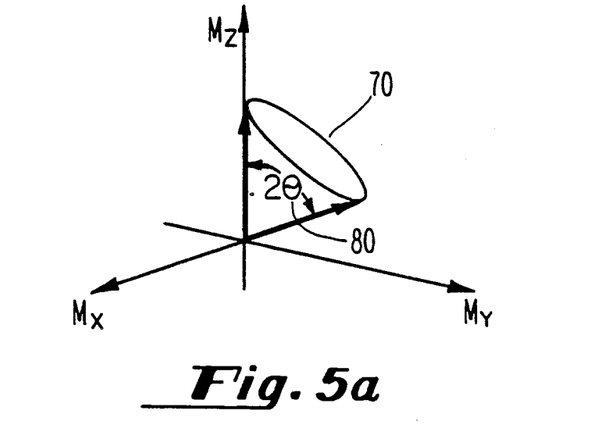
FIGS. 5A through 5D illustrate the total magnetization and components of the magnetization after a second modulating RF pulse is applied to the organ of interest wherein the second RF pulse has the same wavelength as the first RF pulse.
Figure 5B:
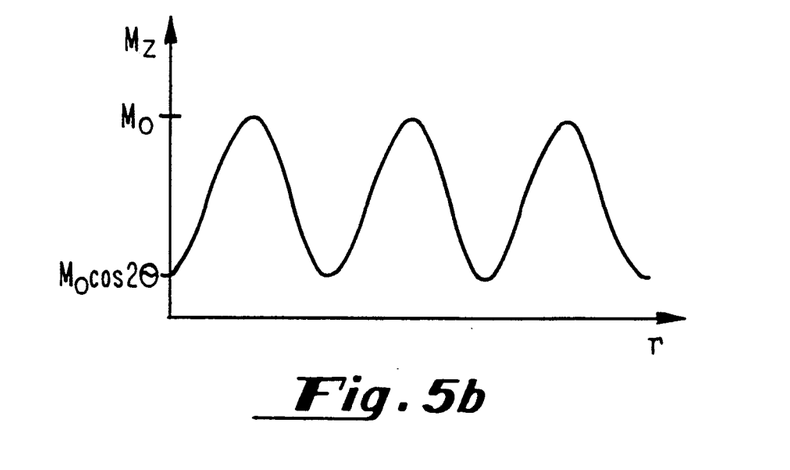
Figure 5C:
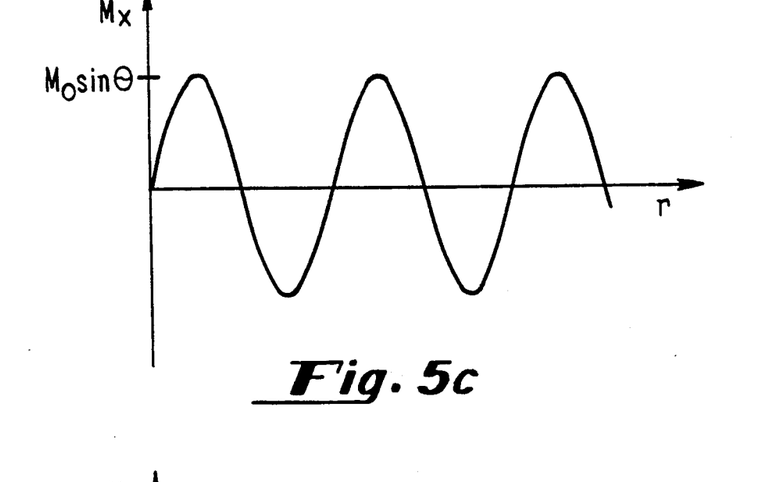
Figure 5D:
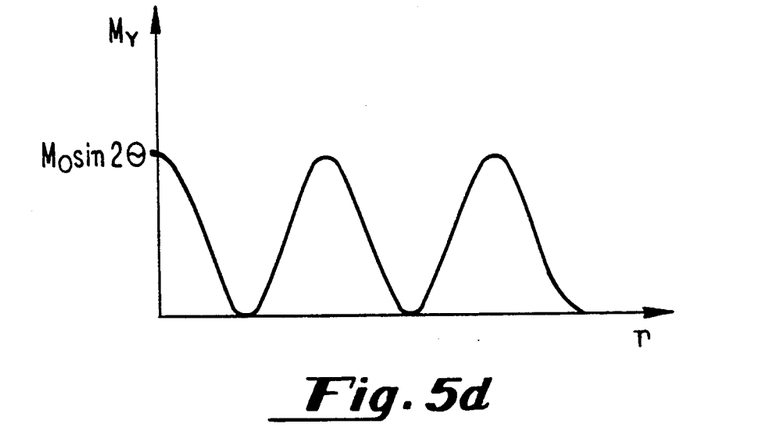

After the second RF pulse 20 is applied at time D in FIG. 1, FIG. 5A shows the magnetization components wherein the resultant magnetization cone 70 has an angle $2\theta$, shown generally at 80, between the Z and X magnetization components. In preferred embodiments, the second RF pulse 20 has the same value as the first RF pulse 10. In FIG. 5B after the second RF pulse is applied to the organ of interest, $M_z$ takes on a sinusoidal value varying between $M_o \cos2\theta$ and $M_o$. In FIG. 5C, $M_x$ is also sinusoidal, having a peak value of $M_o \sin\theta$. Finally in FIG. 5D, $M_y$ now takes on values between $M_o \sin2\theta$ and 0 in a sinusoidal fashion.

Figure 6A:
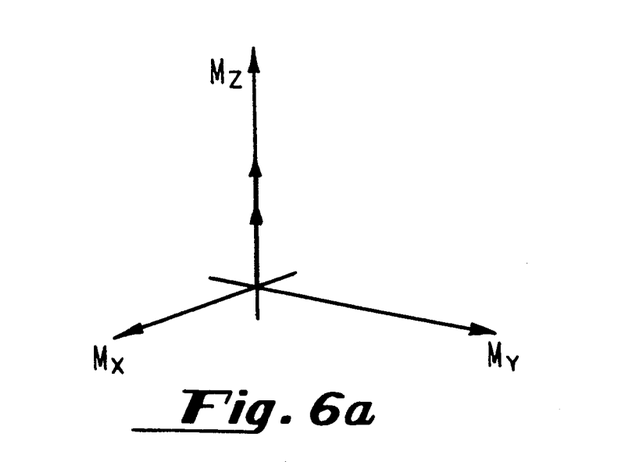
FIGS. 6A and 6B illustrate the magnetization of the organ of interest after significant relaxation has occurred and after remnant transverse magnetization has relaxed or been spoiled.
Figure 6B:
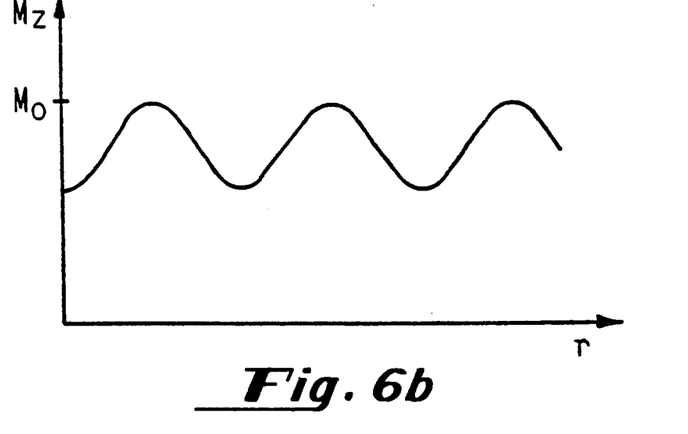

Referring now to FIGS. 6A and 6B, the magnetization of the organ of interest is shown after significant relaxation has occurred at time E in FIG. 1, and after the remnant transverse magnetization has relaxed or been spoiled. In FIG. 6A, the magnetization components are relaxed in the $M_z$ direction. In FIG. 6B, $M_z$ now oscillates from some lower value to a peak value of $M_o$.

Figure 7A:
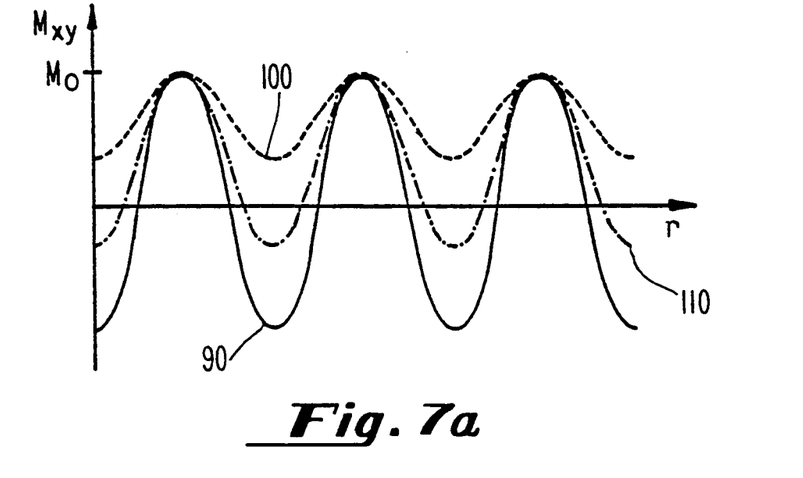
FIG. 7A is a diagram of the transverse magnetization, $M_{xy}$, which is proportional to the image intensity resulting from imaging of the modulated longitudinal magnetization, $M_z$, with differing degrees of modulation of $M_z$ ranging from full inversion in troughs (solid line) to partial saturation (dotted line).
Figure 7B:
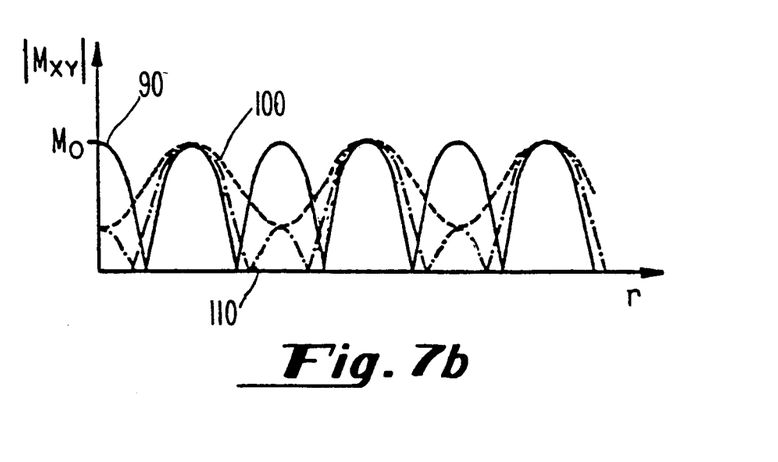
FIG. 7B is a graph of the modulus of $M_{xy}$, $|M_{xy}|$, in FIG. 7A.

FIG. 7A illustrates the magnitude of the transverse magnetization, $M_{xy}$, which is proportional to the image intensity resulting from the imaging of the modulated longitudinal magnetization, $M_z$. Different degrees of modulation of $M_z$ produce differing values of the transverse magnetization, $M_{xy}$. The solid line 90 shows full inversion of the troughs, giving the largest range for the amplitude of $M_{xy}$. The dotted line 100 corresponds to partial saturation of the troughs, and gives a smaller range and variation of the amplitude. An intermediate saturation illustrated by the dotted and dashed line 110 gives an intermediate range for the sinusoidal variation. FIG. 7B graphs the modulus, $|M_{xy}|$. The different initial stages represent different flip angles or different degrees of relaxation after an initial inverting modulation.

For cardiac imaging applications, with interleaved multiplanar image acquisition, a 4-dimensional data set can be acquired consisting of a set of 2-D images at different levels, each at a selected set of delays after R-wave detection. The images of a given level can then be displayed as a cine loop for viewing the motion of the stripes as a function of phase of the cardiac cycle. Another example of the application of SPAMM is the study of the motion of cerebrospinal fluid (CSF).

Although it is straightforward to produce a 2-dimensional array of stripes with SPAMM, their sinusoidal profiles result in an overall decrease in the signal-to-noise ratio of the image and make it more difficult to see the underlying anatomy.

Another principal motion effect in MRI is the production of phase shifts in excited spins moving along magnetic field gradients. Thus, images that display the phase of the signal may be used to demonstrate effects from cardiac motion, as well as blood flow. Although the images produced may look superficially similar, particularly when a strong phase shift is induced across the image by shifting the center of the echo relative to the data acquisition window, the principal phenomenon producing this result is rather different. One potential problem in analysis of such images is in calculating displacement from the phase as the phase shift will generally depend not only on the velocity but also on acceleration and other higher order terms. Other potential sources of phase shifts must also be corrected in order to calculate displacement from the images.

The spacing of the stripes can be easily adjusted by changing the strength and duration of the gradient pulse. In particular, stripes as fine as tens of microns apart can be created. While these are much too fine to be directly imaged, they offer the possibility of being used for the study of very small motions involved in diffusion and perfusion.

In summary, SPAMM provides a simple and effective way to directly demonstrate cardiac motion. It also is useful for studying the flows of blood or CSF and for distinguishing slow flowing blood from thrombus. Adaptation of methods described in accordance with this invention permit a wide range of other applications, including demonstrating the distribution of magnetic field and RF field inhomogeneities and gradient nonlinearities, measuring T1, calibrating gradients and demonstrating chemical shift differences.

There have thus been disclosed improved methods of magnetic resonance imaging of patients while preferred embodiments have been described, it will be recognized by those with ordinary skill in the art that modifications are within the true spirit and scope of the invention. The appended claims are intended to cover all such modifications.

What is claimed is:

1. A method of magnetic resonance imaging of a body portion of a patient, comprising the steps of:
   applying to the body portion an external magnetic field so as to produce a resultant magnetization;
   applying a pre-imaging sequence to the body portion so as to spatially modulate transverse and longitudinal components of the resultant magnetization, thereby producing a spatial modulation pattern of magnetization;

applying an imaging sequence to the body portion to make visible said spatial modulation pattern of magnetization; and providing an image representing the intensity of magnetic resonance signals having said spatial modulation pattern of magnetization which are emitted from the patient.

2. A method as in claim 1, wherein said pre-imaging sequence comprises a first radio-frequency pulse followed by a magnetic field gradient pulse which is followed by a second radio-frequency pulse.

3. A method as in claim 2, wherein said second radio-frequency pulse causes a magnetization change having a magnitude approximately equal to a magnitude of a magnetization change caused by said first radio-frequency pulse.

4. A method as in claim 2, wherein said pre-imaging sequence further comprises a second magnetic field gradient pulse after said second radio-frequency pulse.

5. A method as in claim 4, wherein said second magnetic field gradient pulse causes a magnetization wrap gradient in a different direction from that caused by said magnetic field gradient pulse and said pre-imaging sequence further comprises a third radio-frequency pulse after said second magnetic field gradient pulse.

6. A method of detecting motion of a body portion of a patient using magnetic resonance imaging, comprising the steps of:

applying to the body portion an external magnetic field so as to produce a resultant magnetization;

applying a pre-imaging pulse sequence to the body portion, said pre-imaging pulse sequence comprising a first radio-frequency pulse followed by a magnetic field gradient pulse;

applying an imaging sequence to the body portion to make visible intensity changes of said resultant magnetization caused by said pre-imaging sequence; and detecting motion of said body portion during a time interval between application of said pre-imaging and imaging sequences by examining said intensity changes of said resultant magnetization occurring during said time interval.

7. A method as in claim 6, wherein said pre-imaging sequence further comprises a second radio-frequency pulse after said magnetic field gradient pulse.

8. A method as in claim 7, wherein said second radio-frequency pulse causes a magnetization change having a magnitude approximately equal to a magnitude of a magnetization change caused by said first radio-frequency pulse.

9. A method as in claim 7, wherein said pre-imaging sequence further comprises a second magnetic field gradient pulse after said second radio-frequency pulse.

10. A method as in claim 9, wherein said second magnetic field gradient pulse causes a magnetization wrap gradient in a different direction from that caused by said magnetic field gradient pulse and said pre-imaging sequence further comprises a third radio-frequency pulse after said second magnetic field gradient pulse.

11. A method of detecting motion of a body portion of a patient using magnetic resonance imaging, comprising the steps of:

inducing in the body portion a magnetization vector by applying to the body portion an external magnetic field;

applying a pre-imaging pulse sequence to a body portion, said pre-imaging pulse sequence comprising a first radio-frequency pulse which produces transverse magnetization of the magnetization vector, a magnetic field gradient pulse which modulates the phase of transverse magnetization of the magnetization vector by providing a magnetic field gradient at the body portion and wrapping the phase of the transverse magnetization along the direction of the magnetic field gradient, and a second radio-frequency pulse which amplitude modulates said phase modulated transverse magnetization so as to produce amplitude modulated longitudinal magnetization of the magnetization vector, thereby producing a spatial modulation pattern of said amplitude modulated longitudinal magnetization;

applying an imaging sequence to the body portion to make visible said spatial modulation pattern of amplitude modulated longitudinal magnetization; and detecting motion of said body portion during a time interval between application of said pre-imaging and imaging sequences by examining displacements of the spatial modulation pattern of interest occurring during said time interval.

12. A method as in claim 11, wherein said body portion is the patient's heart wall.

13. A method as in claim 11, wherein said body portion is the patient's blood.

14. A method as in claim 11, wherein said body portion is the patient's cerebrospinal fluid.

15. A method of magnetic resonance imaging a heart wall of a patient for detecting motion of said heart wall, comprising the steps of:

applying to the heart wall an external magnetic field so as to produce a resultant magnetization;

applying a pre-imaging sequence to the heart wall so as to spatially modulate transverse and longitudinal components of the resultant magnetization, thereby producing a spatial modulation patterns of magnetization;

applying a cardiac gated imaging sequence to the heart wall to make visible said spatial modulation pattern of magnetization; and providing an image representing the intensity of magnetic resonance signals having said spatial modulation pattern of magnetization which are emitted from the patient.

16. A method as in claim 15, wherein said pre-imaging sequence comprises a first radio-frequency pulse followed by a magnetic field gradient pulse which is followed by a second radio-frequency pulse.

17. A method as in claim 16, wherein said second radio-frequency pulse causes a magnetization change having a magnitude approximately equal to a magnitude of a magnetization change caused by said first at least one radio-frequency pulse.

18. A method as in claim 16, wherein said pre-imaging sequence further comprises a second magnetic field gradient pulse after said second radio-frequency pulse.

19. A method as in claim 18, wherein said second magnetic field gradient pulse causes a magnetization wrap gradient in a different direction from that caused by said magnetic field gradient pulse and said pre-imaging sequence further comprises a third ratio-frequency pulse after said second magnetic field gradient pulse.

* * * * *

UNITED STATES PATENT AND TRADEMARK OFFICE
CERTIFICATE OF CORRECTION

PATENT NO. : 5,054,489

DATED : October 8, 1991

INVENTOR(S) : Axel et al.

It is certified that error appears in the above-identified patent and that said Letters Patent is hereby corrected as shown below:

Column 2, Line 6, change "FIG." to --FIGS.--.

Column 2, Line 39, after "imaging" delete ",".

Column 2, Line 57, change "A" to --An--.

Column 3, Line 12, change "ca" to --can--.

Column 3, Line 50, change "G.r" to --G·r--.

Column 4, Line 33, change "$\epsilon$" to --$\gamma$--.

Column 4, Line 44, change "ca" to --can--.

Column 5, Line 40, change "motion" to --motions--.

Column 5, Line 45, change "pull-through" to --"pull-through"--.

Column 6, Line 57, after "gradient" add --for production of the spatial modulation in preferred--.

Column 7, Line 33, change "Cos" to --cos--.

Column 8, Line 56, change "patients while" to --patients. While--.

Column 10, Line 58, delete "at least".

UNITED STATES PATENT AND TRADEMARK OFFICE
CERTIFICATE OF CORRECTION

Page 2 of 2

PATENT NO. : 5,054,489
DATED : October 8, 1991
INVENTOR(S) : Axel, et. al.

It is certified that error appears in the above-indentified patent and that said Letters Patent is hereby corrected as shown below:

Column 10, Line 59, delete "one".

Signed and Sealed this

Fifteenth Day of June, 1993

Attest:

MICHAEL K. KIRK

Attesting Officer

Acting Commissioner of Patents and Trademarks